United States Patent
Torii

(10) Patent No.: US 10,727,028 B2
(45) Date of Patent: Jul. 28, 2020

(54) MATCHING DEVICE AND PLASMA PROCESSING APPARATUS

(71) Applicant: TOKYO ELECTRON LIMITED, Tokyo (JP)

(72) Inventor: Natsumi Torii, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 52 days.

(21) Appl. No.: 16/304,370

(22) PCT Filed: May 17, 2017

(86) PCT No.: PCT/JP2017/018458
§ 371 (c)(1),
(2) Date: Nov. 26, 2018

(87) PCT Pub. No.: WO2017/208815
PCT Pub. Date: Dec. 7, 2017

(65) Prior Publication Data
US 2019/0180986 A1 Jun. 13, 2019

(30) Foreign Application Priority Data
May 31, 2016 (JP) .................................. 2016-109001

(51) Int. Cl.
H03H 7/38 (2006.01)
H01J 37/32 (2006.01)
(Continued)

(52) U.S. Cl.
CPC .... H01J 37/32183 (2013.01); H01L 21/3065 (2013.01); H03H 7/38 (2013.01);
(Continued)

(58) Field of Classification Search
CPC .. H03H 7/38; H03H 7/40; H03H 11/28; H01J 37/32183
(Continued)

(56) References Cited

U.S. PATENT DOCUMENTS 6,657,421 B1 * 12/2003 Pastor .................... G05F 5/00
323/303
6,887,339 B1 5/2005 Goodman et al.
2015/0200079 A1 7/2015 Bhutta

FOREIGN PATENT DOCUMENTS

JP H6-296118 A 10/1994
JP 2014-507175 A 3/2014
WO 2012/076844 A1 6/2012

OTHER PUBLICATIONS

International Search Report issued in PCT/JP2017/018458; dated Aug. 15, 2017.
(Continued)

Primary Examiner — Stephen E. Jones
(74) Attorney, Agent, or Firm — Studebaker & Brackett PC

(57) ABSTRACT

Provided is a matching device capable of realizing a high-speed matching operation. A matching device of an embodiment includes a series part, a parallel part, and one or more variable direct-current power sources. The series part includes a first diode having a variable capacitance and is provided between an input terminal of a radio frequency wave and an output terminal of a radio frequency wave. The parallel part includes a second diode having a variable capacitance and is provided between a node between the input terminal and the output terminal and a ground. The one or more variable direct-current power sources are provided to apply variable reverse bias voltages to the first diode and the second diode.

9 Claims, 13 Drawing Sheets

(51) Int. Cl.
   *H01L 21/3065*   (2006.01)
   *H03H 11/28*    (2006.01)
   *H01L 21/67*    (2006.01)

(52) U.S. Cl.
   CPC .... *H03H 11/28* (2013.01); *H01J 2237/24564* (2013.01); *H01J 2237/334* (2013.01); *H01L 21/67069* (2013.01)

(58) Field of Classification Search
   USPC ........................ 333/32, 33, 17.3; 315/111.21
   See application file for complete search history.

(56) References Cited

OTHER PUBLICATIONS

Tian Long; "Antenna self-adaptive impedance match system design and implementation"; Chinese Master's Theses Full-text Database Information Science and Technology; Nov. 15, 2013; with partial English Translation.
An Office Action mailed by the Chinese Patent Office dated Mar. 2, 2020, which corresponds to Chinese Patent Application No. 201780032809.4 and is related to U.S. Appl. No. 16/304,370.

* cited by examiner

MATCHING DEVICE AND PLASMA PROCESSING APPARATUS

TECHNICAL FIELD

Embodiments of the present disclosure relate to a matching device and a plasma processing apparatus.

BACKGROUND ART

In the manufacture of electronic devices such as semiconductor devices, a plasma processing apparatus is used to perform plasma processing, for example, plasma etching, on a workpiece. The plasma processing apparatus is provided with a chamber body, an electrode, a radio frequency power source, and a matching device. The chamber body provides an internal space thereof as a chamber. The electrode is an electrode for generation of plasma or generation of a bias in the chamber. The radio frequency power source generates a radio frequency wave. The radio frequency power source is connected to the electrode through the matching device. The matching device has a circuit for matching the output impedance of the radio frequency power source and the impedance of a load.

A circuit of the matching device which is used in the plasma processing apparatus generally has a variable capacitor capable of mechanically changing a capacitance. Such a variable capacitor cannot change the capacitance at high speed. Therefore, the matching device cannot perform a high-speed matching operation. As a measure for realizing a high-speed matching operation of the matching device, a technique of using a field-effect transistor instead of a variable capacitor is disclosed in Patent Literature 1.

CITATION LIST

Patent Literature

[Patent Literature 1] U.S. Pat. No. 6,887,339

SUMMARY OF INVENTION

Technical Problem

However, in the field-effect transistor, a loss of a radio frequency wave is large. Therefore, a matching device which has another element instead of a variable capacitor capable of mechanically changing a capacitance and can realize a high-speed matching operation is required.

Solution to Problem

In an aspect, there is provided a matching device for impedance matching of a plasma processing apparatus. The matching device includes a series part, a parallel part, and a plurality of direct-current power sources. The series part includes a first diode having a variable capacitance and is provided between an input terminal of a radio frequency wave and an output terminal of a radio frequency wave. The parallel part includes a second diode having a variable capacitance and is provided between a node between the input terminal and the output terminal and a ground. The plurality of direct-current power sources are provided to apply reverse bias voltages to the first diode and the second diode, respectively.

In the matching device according to the aspect, the first diode and the second diode which are PN junction diodes are used rather than a variable capacitor capable of mechanically changing a capacitance. The capacitance (junction capacitance) of each of the first diode and the second diode changes rapidly in response to a reverse bias voltage. Therefore, a matching device capable of realizing a high-speed matching operation is provided.

In an embodiment, the series part further includes a first capacitor connected in series to the first diode, and the parallel part further includes a second capacitor connected in series to the second diode. The first capacitor is connected between the node and the first diode. The second capacitor is connected between the ground and the second diode. According to the embodiment, a direct-current potential is separated between the ground and the second diode, and a direct-current potential is separated between the series part and the parallel part.

In an embodiment, the series part includes a plurality of first diodes and a plurality of first capacitors. The plurality of first diodes include the first diode and are diodes having a variable capacitance. The plurality of first diodes are provided on a side of the output terminal with respect to the first capacitor. The plurality of first capacitors include the first capacitor. A plurality of first element groups are connected in order between the input terminal and the output terminal. Each of the plurality of first element groups includes one first diode among the plurality of first diodes, and one first capacitor connected in series to the one first diode, among the plurality of first capacitors. One direct-current power source among the plurality of direct-current power sources is provided to apply reverse bias voltages to the plurality of first diodes.

In an embodiment, one first capacitor among the plurality of first capacitors is provided between two first diodes connected in series to each other, among the plurality of first diodes. The two first diodes connected in series to each other are directed in the same direction between the input terminal and the output terminal. That is, one of an anode and a cathode of each of the two first diodes connected in series to each other is connected to the input terminal side and the other is connected to the output terminal side. In the embodiment, a direct-current potential between the two first diodes connected in series to each other is separated. Therefore, one variable direct-current power source can be used to apply reverse bias voltages to the two first diodes. Therefore, the number of variable direct-current power sources is reduced.

In an embodiment, two first diodes connected in reverse series to each other, among the plurality of first diodes, are directly connected to each other. The two first diodes connected in reverse series to each other are directed in mutually opposite directions between the input terminal and the output terminal. That is, in the embodiment, anodes or cathodes of the two first diodes are directly connected to each other. In order to apply reverse bias voltages to the two first diodes connected in reverse series to each other, one variable direct-current power source can be used. Therefore, the number of variable direct-current power sources is reduced.

In an embodiment, the parallel part includes a plurality of second diodes and a plurality of second capacitors. The plurality of second diodes include the second diode and are diodes having a variable capacitance. The plurality of second diodes are provided on a side of the node with respect to the second capacitor. The plurality of second capacitors include the second capacitor. A plurality of second element groups are connected in order between the node and the ground. The plurality of second element groups include one second diode among the plurality of second diodes, and one second capacitor connected in series to the one second diode, among the plurality of second capacitors. Another direct-current power source among the plurality of direct-current power sources is provided to apply reverse bias voltages to the plurality of second diodes.

In an embodiment, one second capacitor among the plurality of second capacitors is provided between the two second diodes connected in series to each other, among the plurality of second diodes. The two second diodes connected in series to each other are directed in the same direction between the node and the ground. That is, one of an anode and a cathode of each of the two second diodes connected in series to each other is connected to the node side and the other is connected to the ground side. In the embodiment, a direct-current potential between the two second diodes connected in series to each other is separated. Therefore, one variable direct-current power source can be used to apply reverse bias voltages to the two second diodes. Therefore, the number of variable direct-current power sources is reduced.

In an embodiment, two second diodes connected in reverse series to each other, among the plurality of second diodes, are directly connected to each other. The two second diodes connected in reverse series to each other are directed in mutually opposite directions between the node and the ground. That is, in this embodiment, the anodes or the cathodes of the two second diodes are directly connected to each other. In order to apply reverse bias voltages to the two second diodes connected in reverse series to each other, one variable direct-current power source can be used. Therefore, the number of variable direct-current power sources is reduced.

According to another aspect, there is provided a plasma processing apparatus. The plasma processing apparatus includes a chamber body, a radio frequency power source, and an electrode. The chamber body provides the internal space thereof as a chamber. The electrode is an electrode for generation of plasma or generation of a bias in the chamber and is electrically connected to the radio frequency power source. The plasma processing apparatus further includes the matching device according to the aspect described above or any one of various embodiments described above. The matching device is connected between the radio frequency power source and the electrode.

Advantageous Effects of Invention

As described above, a matching device capable of realizing a high-speed matching operation is provided.

DESCRIPTION OF EMBODIMENTS

Figure 1:
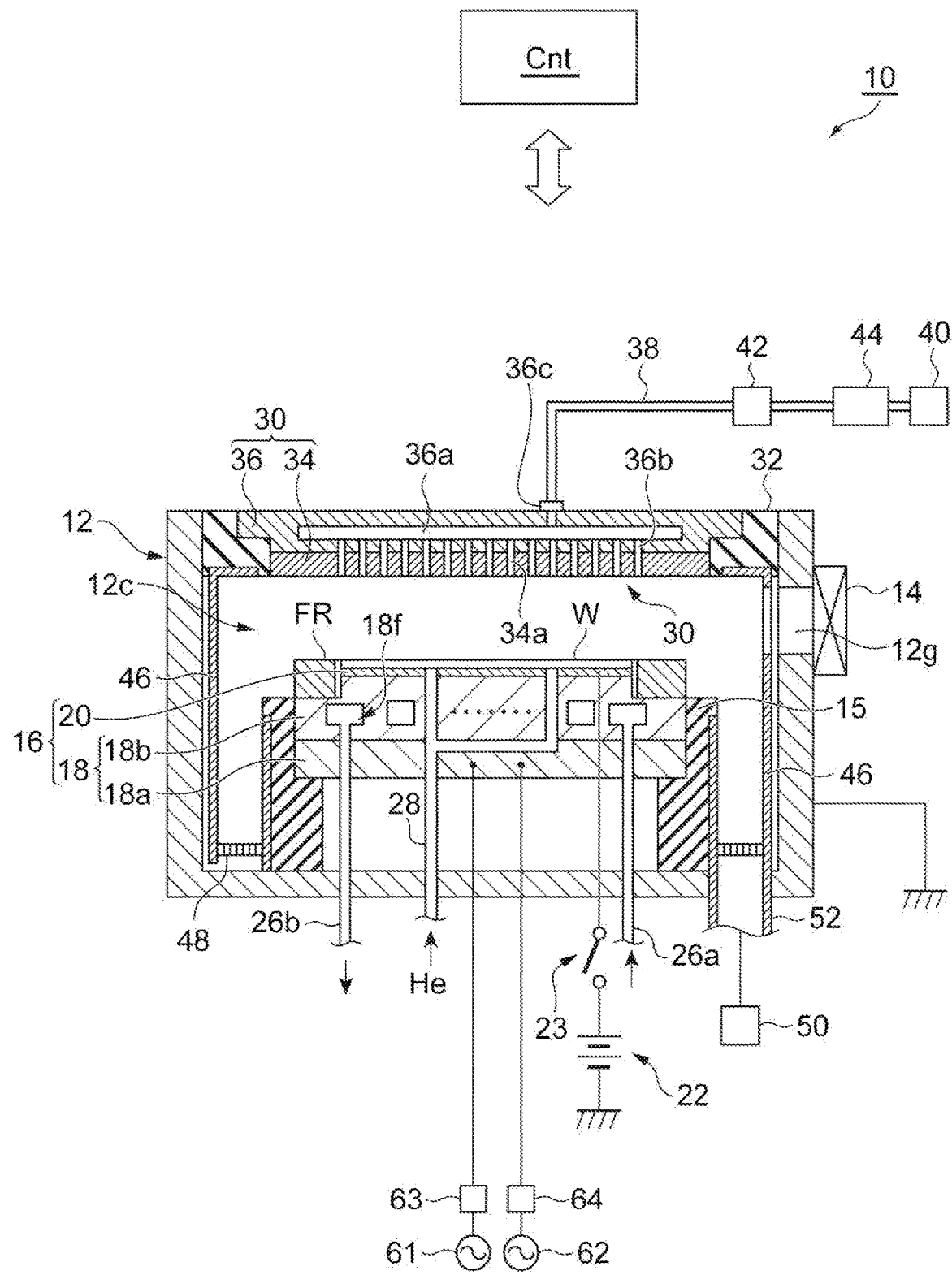
FIG. 1 schematically illustrates a plasma processing apparatus according to an embodiment.

Hereinafter, various embodiments will be described in detail with reference to the drawings. In the drawings, identical or corresponding parts are denoted by the same reference symbols.

FIG. 1 schematically illustrates a plasma processing apparatus according to an embodiment. In FIG. 1, a structure in the longitudinal section of the plasma processing apparatus according to an embodiment is schematically shown. A plasma processing apparatus 10 shown in FIG. 1 is a capacitively coupled plasma etching apparatus.

The plasma processing apparatus 10 is provided with a chamber body 12. The chamber body 12 has a substantially cylindrical shape. The chamber body 12 provides the internal space thereof as a chamber 12c. The chamber body 12 is made of, for example, aluminum. A film having plasma resistance is formed on the inner wall surface of the chamber body 12, that is, the wall surface defining the chamber 12c. The film may be a film formed by anodizing processing or a film made of a ceramics such as yttrium oxide. Further, an opening 12g for transfer of a workpiece W is provided in a side wall of the chamber body 12. The opening 12g can be opened and closed by a gate valve 14. The chamber body 12 is grounded.

In the chamber 12c, a support part 15 extends upward from a bottom portion of the chamber body 12. The support part 15 has a substantially cylindrical shape and is formed of an insulating material such as quartz. Further, a placing table 16 is provided in the chamber 12c. The placing table 16 is configured to hold the workpiece W on the upper surface thereof. The workpiece W may have a disk shape like a wafer. The placing table 16 includes a lower electrode 18 and an electrostatic chuck 20. The placing table 16 is supported by the support part 15.

The lower electrode 18 includes a first plate 18a and a second plate 18b. Each of the first plate 18a and the second plate 18b is formed of metal such as aluminum, for example, and has a substantially disk shape. The second plate 18b is provided on the first plate 18a and is electrically connected to the first plate 18a.

The electrostatic chuck 20 is provided on the second plate 18b. The electrostatic chuck 20 has an insulating layer and an electrode built in the insulating layer. A direct-current power source 22 is electrically connected to the electrode of the electrostatic chuck 20 through a switch 23. When a direct-current voltage from the direct-current power source 22 is applied to the electrode of the electrostatic chuck 20, the electrostatic chuck 20 generates an electrostatic force such as a Coulomb's force. The electrostatic chuck 20 attracts the workpiece W by the electrostatic force and holds the workpiece W.

A focus ring FR is disposed on a peripheral portion of the second plate 18b so as to surround the edge of the workpiece W and the electrostatic chuck 20. The focus ring FR is provided in order to improve the uniformity of the plasma processing. The focus ring FR is formed of a material which is appropriately selected according to the plasma processing, and may be formed of, for example, quartz.

A flow channel 18f is provided in the interior of the second plate 18b. A refrigerant is supplied from a chiller unit provided outside the chamber body 12 to the flow channel 18f through a pipe 26a. The refrigerant supplied to the flow channel 18f is returned to the chiller unit through a pipe 26b. In this manner, the refrigerant is supplied to the flow path 18f so as to circulate in the flow path 18f. The temperature of the workpiece W supported by the electrostatic chuck 20 is controlled by controlling the temperature of the refrigerant.

Further, the plasma processing apparatus 10 is provided with a gas supply line 28. The gas supply line 28 supplies a heat transfer gas, for example, He gas, from a heat transfer gas supply mechanism, between the upper surface of the electrostatic chuck 20 and the back surface of the workpiece W.

The plasma processing apparatus 10 is further provided with an upper electrode 30. The upper electrode 30 is provided above the placing table 16 and is provided substantially parallel to the lower electrode 18. The upper electrode 30 closes an upper opening of the chamber body 12 together with a member 32. The member 32 has insulating properties. The upper electrode 30 is supported on an upper portion of the chamber body 12 through the member 32.

The upper electrode 30 includes a top plate 34 and a support 36. The top plate 34 faces the chamber 12c. A plurality of gas delivery holes 34a are provided in the top plate 34. The top plate 34 is made of, for example, silicon, although there is no limitation thereto. Alternatively, the top plate 34 may have a structure in which a plasma-resistant film is provided on the surface of a base member made of aluminum. The film may be a film formed by anodizing processing or a film made of a ceramics such as yttrium oxide.

The support 36 detachably supports the top plate 34 and may be made of a conductive material such as aluminum, for example. A gas diffusion chamber 36a is provided in the interior of the support 36. A plurality of gas holes 36b extend downward from the gas diffusion chamber 36a, and the plurality of gas holes 36b communicate with the plurality of gas delivery holes 34a, respectively. Further, a gas introduction port 36c for leading a processing gas to the gas diffusion chamber 36a is formed in the support 36, and a gas supply pipe 38 is connected to the gas introduction port 36c.

A gas source group 40 is connected to the gas supply pipe 38 through a valve group 42 and a flow rate controller group 44. The gas source group 40 has a plurality of gas sources. The valve group 42 includes a plurality of valves, and the flow rate controller group 44 includes a plurality of flow rate controllers such as mass flow controllers. Each of the plurality of gas sources of the gas source group 40 is connected to the gas supply pipe 38 through a corresponding valve of the valve group 42 and a corresponding flow rate controller of the flow rate controller group 44. The plasma processing apparatus 10 is capable of supplying gases from one or more gas sources selected from among the plurality of gas sources of the gas source group 40 into the chamber body 12 at individually adjusted flow rates.

Further, in the plasma processing apparatus 10, a shield member 46 is provided along the inner wall of the chamber body 12. The shield member 46 is also provided at the outer periphery of the support part 15. The shield member 46 prevents a substance such as a reaction product which is generated by the plasma processing (for example, etching) from sticking to the chamber body 12. The shield member 46 may be formed by coating a base member made of aluminum with a ceramics such as Y2O3.

A baffle plate 48 is provided between the support part 15 and the side wall of the chamber body 12 in the chamber 12c. The baffle plate 48 may be formed, for example, by coating an aluminum base member with a ceramics such as yttrium oxide. A plurality of through-holes are formed in the baffle plate 48. An exhaust pipe 52 is connected to the bottom portion of the chamber body 12 below the baffle plate 48. An exhaust device 50 is connected to the exhaust pipe 52. The exhaust device 50 has a vacuum pump such as a turbo molecular pump and reduces the pressure in the chamber 12c.

Further, the plasma processing apparatus 10 is further provided with a first radio frequency power source 61 and a second radio frequency power source 62. The first radio frequency power source 61 is a power source for generating a first radio frequency wave for plasma generation. The frequency of the first radio frequency wave is a frequency within a range of 27 to 100 MHz and is, for example, 40 MHz, although there is no limitation thereto. The first radio frequency power source 61 is connected to the lower electrode 18 through a matching device 63. The matching device 63 has a circuit for matching the output impedance of the first radio frequency power source 61 and the input impedance on the load side (the lower electrode 18 side). In the embodiment, that is an embodiment in which the first radio frequency power source 61 is electrically connected to the lower electrode 18, the upper electrode 30 is grounded. The first radio frequency power source 61 may be connected to the upper electrode through the matching device 63.

The second radio frequency power source 62 is a power source for generating a second radio frequency wave for drawing ions to the workpiece W, that is, for bias. The frequency of the second radio frequency wave is a frequency within a range of 400 kHz to 13.56 MHz and is, for example, 3.2 MHz, although there is no limitation thereto. The second radio frequency power source 62 is connected to the lower electrode 18 through a matching device 64. The matching device 64 has a circuit for matching the output impedance of the second radio frequency power source 62 and the input impedance on the load side (the lower electrode 18 side).

In an embodiment, the plasma processing apparatus 10 is further provided with a control unit Cnt. The control unit Cnt is a computer which includes a processor, a storage device, an input device, a display device, and the like, and controls each part of the plasma processing apparatus 10. Specifically, the control unit Cnt executes a control program stored in the storage device and controls each part of the plasma processing apparatus 10, based on recipe data stored in the storage device. In this way, the plasma processing apparatus 10 is configured to execute a process specified by the recipe data.

At the time of the execution of the plasma processing using the plasma processing apparatus 10, the gas from the gas source selected from among the plurality of gas sources of the gas source group 40 is supplied to the chamber 12c. Further, the chamber 12c is depressurized by the exhaust device 50. Then, the gas supplied to the chamber 12c is excited by a radio frequency electric field which is generated by the first radio frequency wave from the first radio frequency power source 61. In this way, plasma is generated in the chamber 12c. The workpiece W is processed by ions and/or radicals in the plasma thus generated. The second radio frequency wave may be supplied to the lower electrode 18. When the second radio frequency wave is supplied to the lower electrode 18, ions in the plasma are accelerated toward the workpiece W.

Hereinafter, some embodiments of a matching device for impedance matching, which can be adopted as one or both of the matching device 63 and the matching device 64, will be described.

Figure 2:
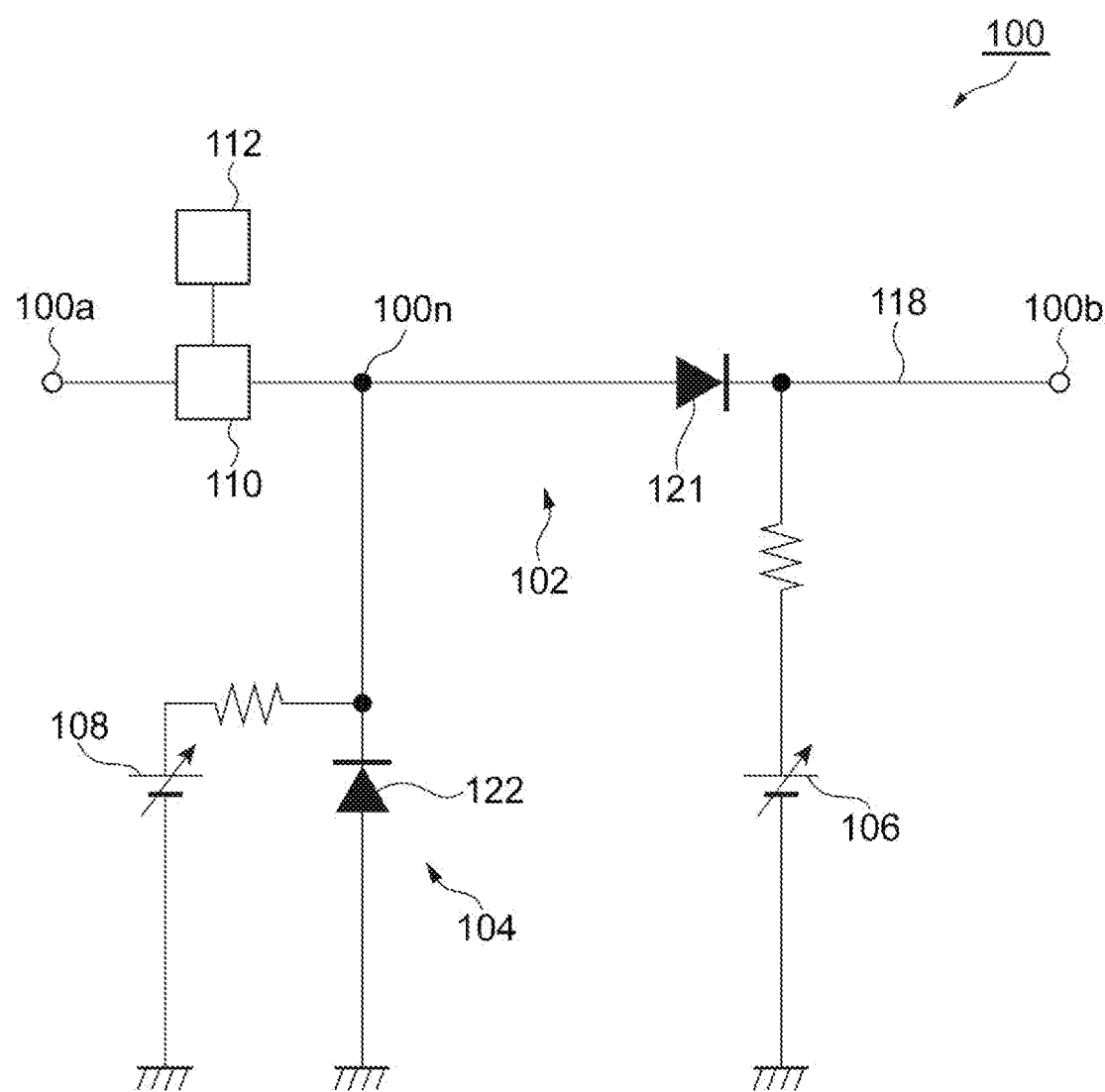
FIG. 2 illustrates a matching device according to an embodiment.

FIG. 2 illustrates a matching device according to an embodiment. A matching device 100 shown in FIG. 2 includes a series part 102, a parallel part 104, a direct-current power source 106, and a direct-current power source 108. The matching device 100 may further include an impedance sensor 110 and a power source control unit 112.

The series part 102 is provided on a power supply line 118 between an input terminal 100a and an output terminal 100b of the matching device 100. The input terminal 100a is a terminal to which a radio frequency wave is input. That is, the input terminal 100a is a terminal which is connected to a radio frequency power source. The output terminal 100b is a terminal for outputting a radio frequency wave. That is, the output terminal 100b is a terminal which is connected to the load on the chamber body 12 side. The series part 102 includes a first diode 121. The first diode 121 is a diode having a variable capacitance. The first diode 121 may be a PN junction diode, a Schottky barrier diode, or a variable-capacitance diode. Further, the first diode 121 may be a diode which includes a low-concentration semiconductor region between a P-type region and an N-type region. In an embodiment, the anode of the first diode 121 is connected to the input terminal 100a, and the cathode of the first diode 121 is connected to the output terminal 100b.

The parallel part 104 is provided between a node 100n and the ground. The node 100n is provided on the power supply line 118 between the input terminal 100a and the output terminal 100b. In an embodiment, the node 100n is provided on the power supply line 118 between the first diode 121 and the input terminal 100a. The parallel part 104 includes a second diode 122. The second diode 122 is a diode having a variable capacitance. The second diode 122 may be a PN junction diode, a Schottky barrier diode, or a variable-capacitance diode. Further, the second diode 122 may be a diode which includes a low-concentration semiconductor region between a P-type region and an N-type region. In an embodiment, the anode of the second diode 122 is connected to the ground, and the cathode of the second diode 122 is connected to the node 100n.

The direct-current power source 106 is a variable direct-current power source and is provided to apply a reverse bias voltage to the first diode 121. The positive electrode of the direct-current power source 106 is connected to the cathode of the first diode 121, and the negative electrode of the direct-current power source 106 is connected to the ground.

The direct-current power source 108 is a variable direct-current power source and is provided to apply a reverse bias voltage to the second diode 122. The positive electrode of the direct-current power source 108 is connected to the cathode of the second diode 122 through a resistor element, and the negative electrode of the direct-current power source 108 is connected to the ground.

The impedance sensor 110 is provided on the power supply line 118 between the node 100n and the input terminal 100a. The impedance sensor 110 is a sensor configured to measure a load impedance (an impedance on the chamber body 12 side). The impedance sensor 110 outputs the measured load impedance to the power source control unit 112. The power source control unit 112 has, for example, a processor. The power source control unit 112 controls the direct-current power source 106 and the direct-current power source 108 such that the input load impedance is brought close to or matched with a predetermined impedance (for example, 50Ω). As a result, the reverse bias voltage which is applied to the first diode 121 and the reverse bias voltage which is applied to the second diode 122 are adjusted, the capacitance and/or the inductance of the first diode 121 is adjusted, and the capacitance and/or the inductance of the second diode 122 is adjusted.

In the matching device 100, the first diode 121 and the second diode 122 are used rather than a variable capacitor capable of mechanically changing a capacitance. The capacitance (junction capacitance) of each of the first diode 121 and the second diode 122 changes rapidly in response to the reverse bias voltage. Therefore, the matching device 100 can realize a high-speed matching operation.

Figure 3:
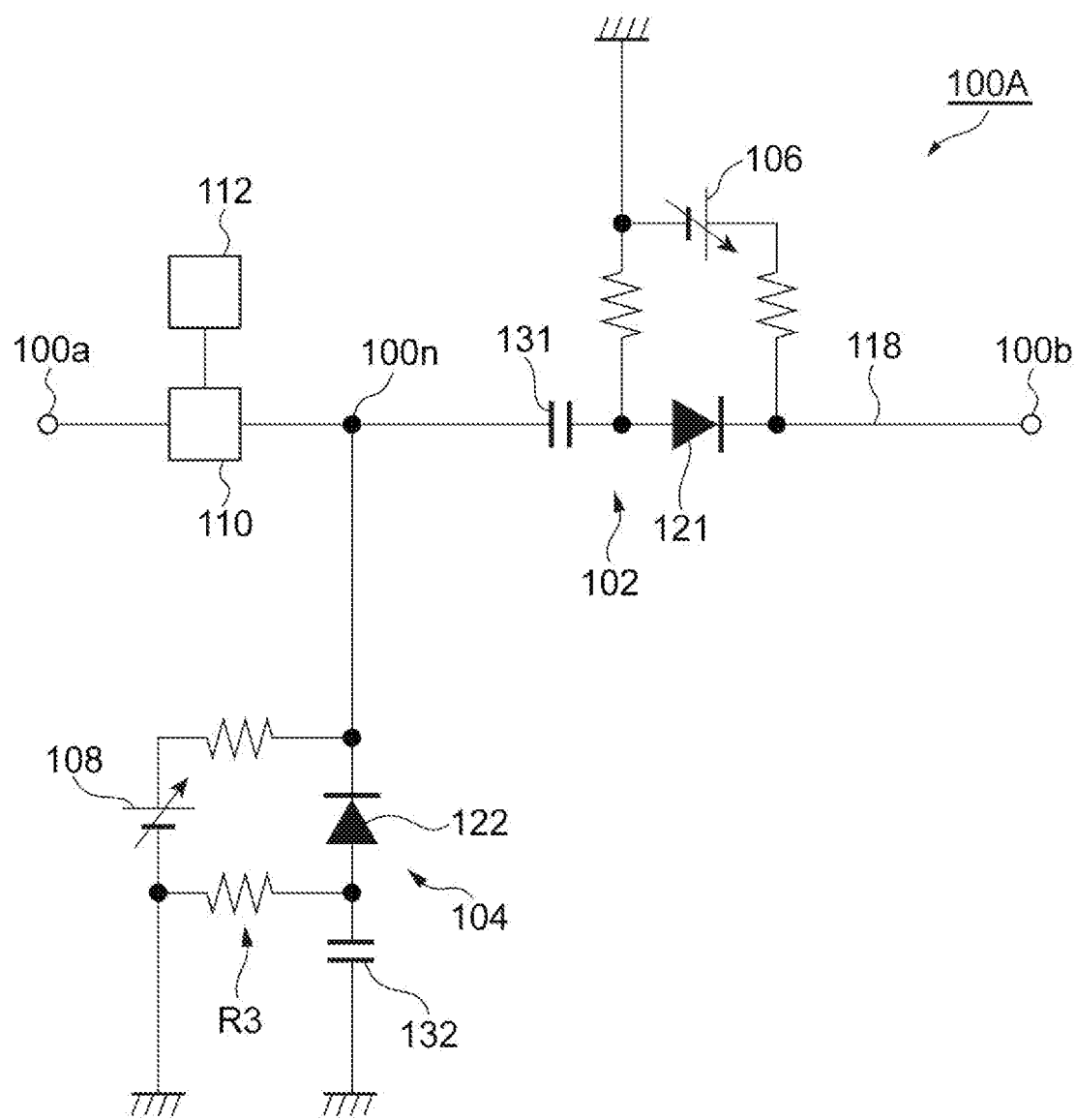
FIG. 3 illustrates a matching device according to another embodiment.
Figure 4:
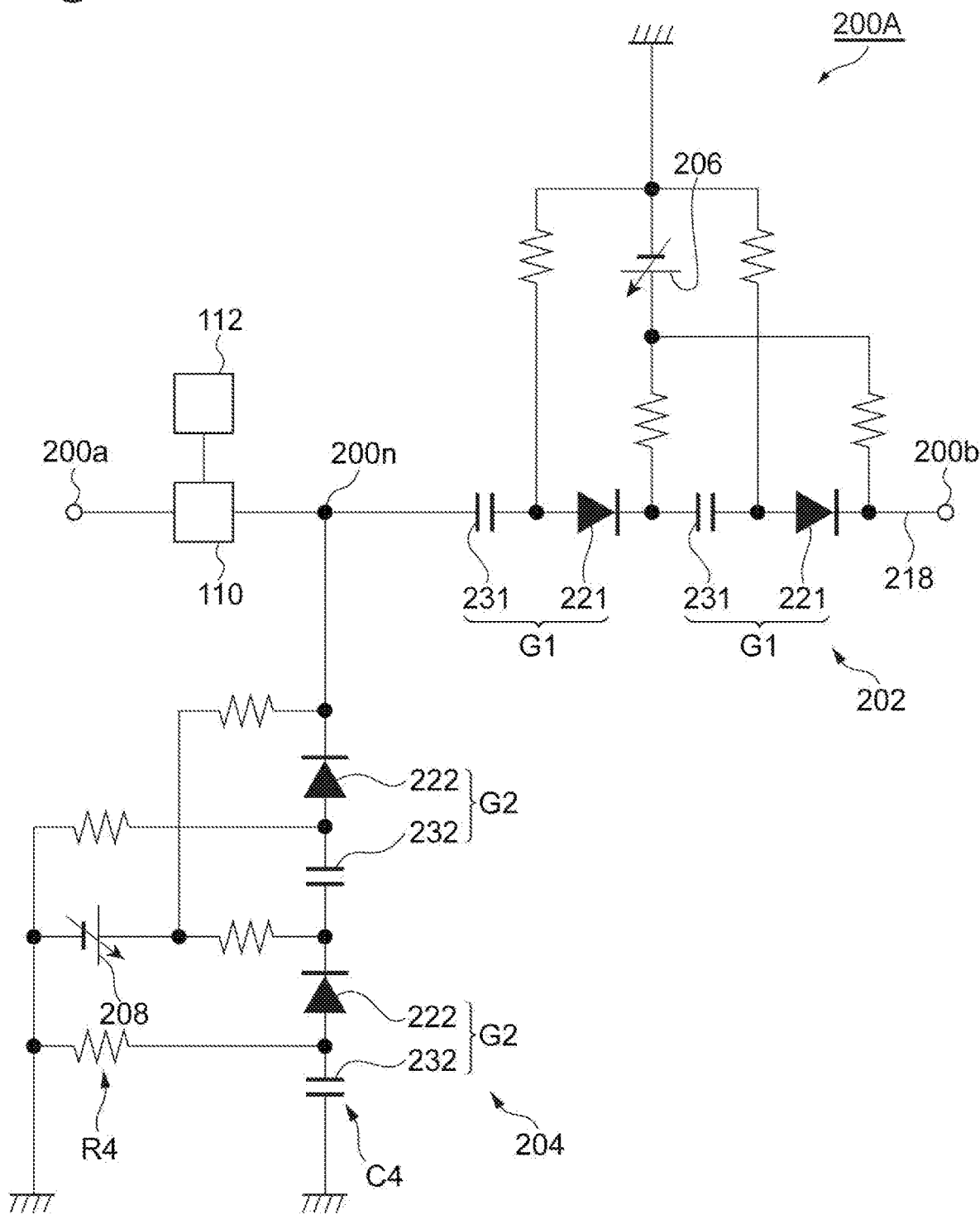
FIG. 4 illustrates a matching device according to still another embodiment.

FIG. 3 illustrates a matching device according to another embodiment. Hereinafter, different points of a matching device 100A from the matching device 100 will be described, and overlapping description will be omitted.

In the matching device 100A shown in FIG. 3, the series part 102 further has a first capacitor 131, and the parallel part 104 further has a second capacitor 132. The first capacitor 131 is connected in series to the first diode 121. The first capacitor 131 is connected between the node 100n and the first diode 121. The second capacitor 132 is connected between the second diode 122 and the ground. The positive electrode of the direct-current power source 106 is connected to the cathode of the first diode 121 through a resistor element. The negative electrode of the direct-current power source 106 is connected to the anode of the first diode 121 through a resistor element. Further, the positive electrode of the direct-current power source 108 is connected to the cathode of the second diode 122 through a resistor element. The negative electrode of the direct-current power source 108 is connected to the anode of the second diode 122 through a resistor element R3. The resistor element R3 and the second capacitor 132 may be omitted. In the matching device 100A, a direct-current potential is separated between the ground and the second diode 122, and a direct-current potential is separated between the series part 102 and the parallel part 104.

Figure 8:
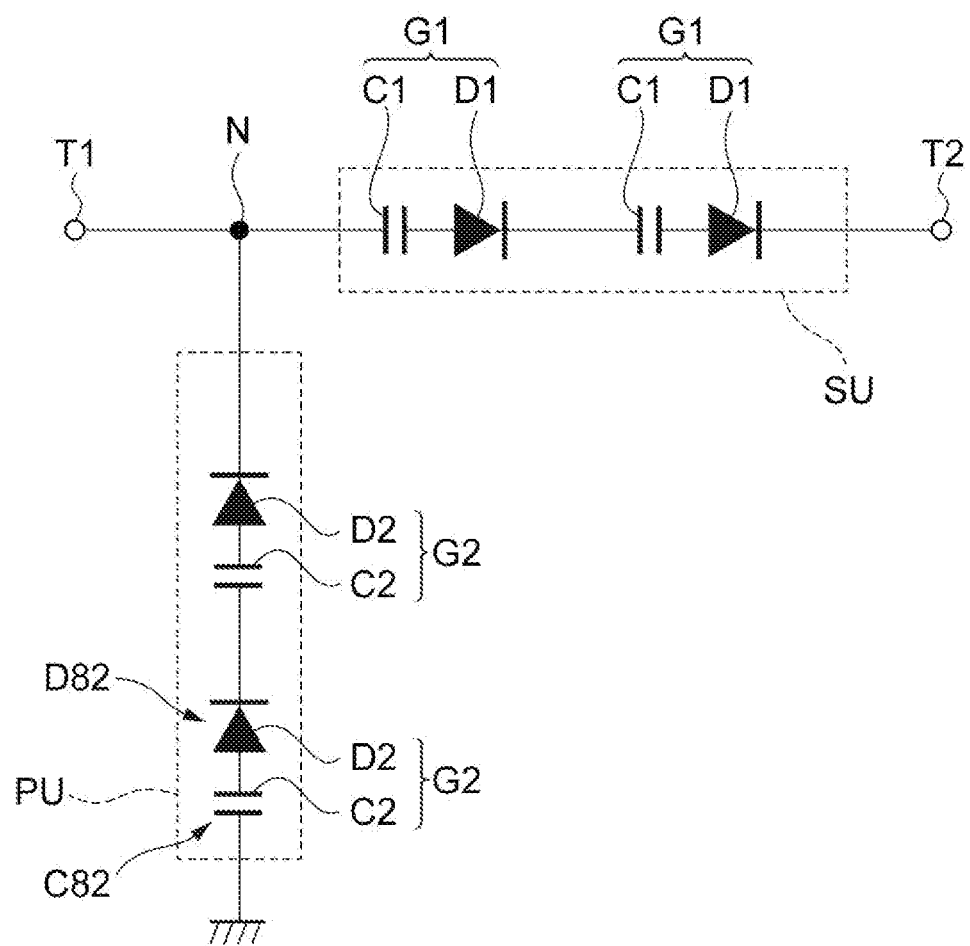
FIG. 8 illustrates a rule concerning a layout of a circuit of a matching device.
Figure 9:
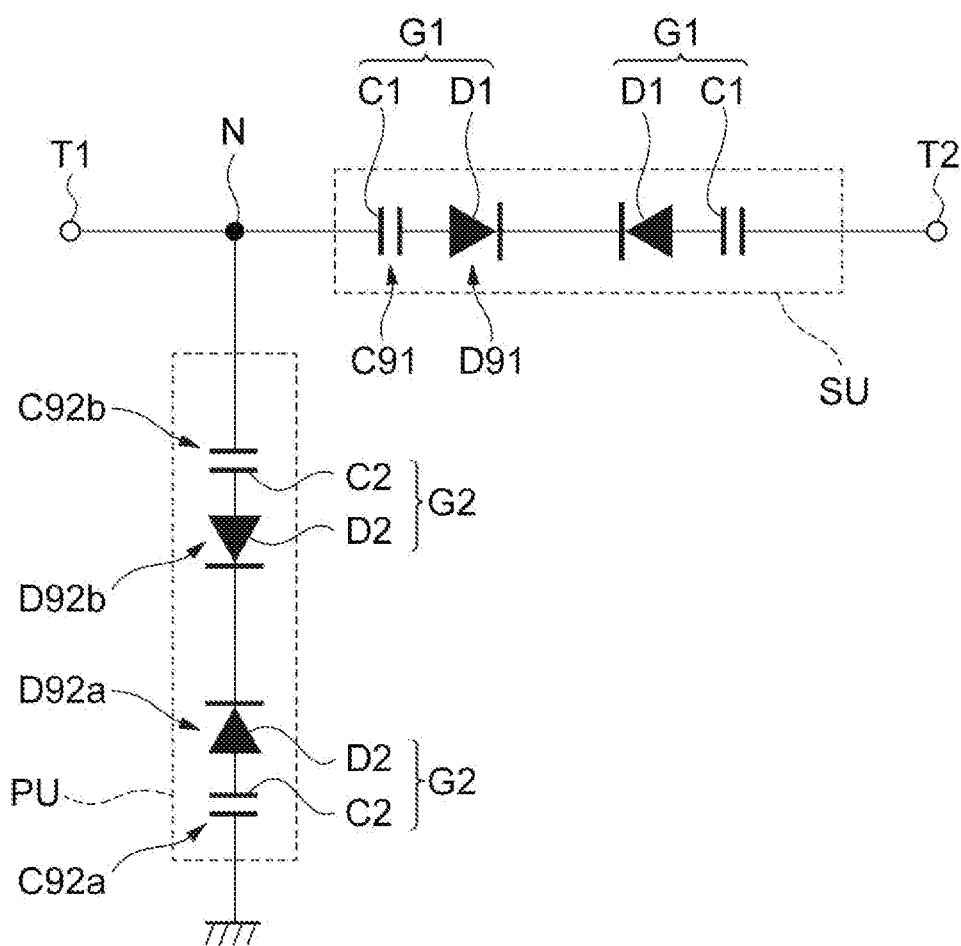
FIG. 9 illustrates a rule concerning a layout of a circuit of a matching device.
Figure 10:
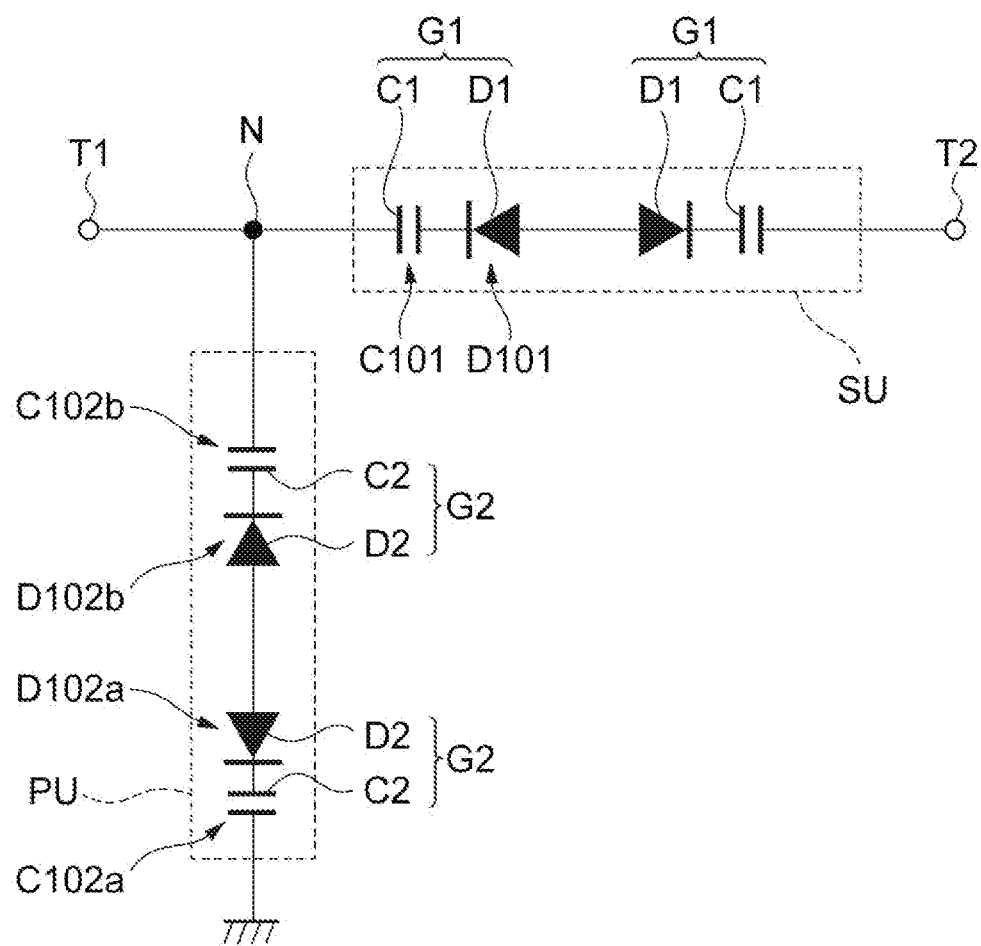
FIG. 10 illustrates a rule concerning a layout of a circuit of a matching device.

Hereinafter, matching devices according to some other embodiments will be described with reference to FIGS. 4 to 7. The layouts of circuits in the matching devices shown in FIGS. 4 to 7 comply with first to third rules. The first to third rules will be described with reference to FIGS. 8 to 10. FIGS. 8 to 10 illustrates the rules concerning the layout of the circuit of the matching device. In FIGS. 8 to 10, the input terminal, the output terminal, the node between the input terminal and the output terminal, the series part, the parallel part, the first diode, the second diode, the first capacitor, and the second capacitor of the matching device are denoted by reference symbols "T1", "T2", "N", "SU", "PU", "D1", "D2", "C1", and "C2", respectively.

The series part SU has one or more first element groups G1. In the examples shown in FIGS. 8 to 10, the series part SU has a plurality of first element groups G1. The plurality of first element groups G1 are connected in order between the input terminal T1 and the output terminal T2. Each of the plurality of first element groups G1 includes the first diode D1 and the first capacitor C1 connected in series to the first diode D1. The parallel part PU has one or more second element groups G2. In the examples shown in FIGS. 8 to 10, the parallel part PU has a plurality of second element groups G2. The plurality of second element groups G2 are connected in order between the node N and the ground. Each of the plurality of second element groups G2 includes the second diode D2 and the second capacitor C2 connected in series to the second diode D2. Each of the first diode D1 and the second diode D2 may be a PN junction diode, a Schottky barrier diode, or a variable-capacitance diode. Each of the first diode D1 and the second diode D2 may be a diode which includes a low-concentration semiconductor region between a P-type region and an N-type region.

As shown in FIGS. 8 to 10, the first rule is a rule that one second capacitor C2 which is included in the parallel part PU separates a direct-current potential between all the second diodes D2 which are included in the parallel part PU and the ground. Therefore, all the second diodes D2 which are included in the parallel part PU are provided on the node N side with respect to the one second capacitor C2. This first rule includes an exception. The exception to the first rule is an exception that in a case where the potential of one terminal (the anode or the cathode) of one second diode D2 which is closest to the ground on an electrical path of the parallel part PU between the node N and the ground, among all the second diodes D2 which are included in the parallel part PU, is set to the ground potential and the one terminal is present on the ground side on the electrical path with respect to the other terminal (the cathode or the anode), the one terminal of the one second diode D2 and the ground can be directly connected to each other with the second capacitor C2 between them omitted. According to the exception to the first rule, a second capacitor C82 shown in FIG. 8 can be omitted in a case where the potential of the anode of a second diode D82 is set to the ground potential. Further, a second capacitor C92a shown in FIG. 9 can be omitted in a case where the potential of the anode of a second diode D92a is set to the ground potential. Further, a second capacitor C102a shown in FIG. 10 can be omitted in a case where the potential of the cathode of a second diode D102a is set to the ground potential.

The second rule is a rule that one first capacitor C1 which is included in the series part SU separates a direct-current potential between the series part SU and the parallel part PU. Therefore, all the first diodes D1 which are included in the series part SU are provided on the output terminal 12 side with respect to the one first capacitor C1. The second rule includes an exception. The exception to the second rule is an exception that in a case where the potential of the terminal on the node N side of one first diode D1 which is closest to the node N on an electrical path of the series part SU between the node N and the output terminal T2, among all the first diodes D1 of the series part SU, and the potential of the terminal on the node N side of one second diode D2 which is closest to the node N on the electrical path of the parallel part PU between the node N and the ground, among all the second diodes D2 of the parallel part PU, are set to the ground potential, the one first diode D1 and the one second diode D2 can be directly connected to each other with a capacitor between them omitted. According to the exception to the second rule, in a case where the potential of the anode of a first diode D91 and the potential of the anode of a second diode D92b shown in FIG. 9 are set to the ground potential, a first capacitor C91 and a second capacitor C92b can be omitted. Further, in a case where the potential of the cathode of a first diode D101 and the potential of the cathode of a second diode D102b shown in FIG. 10 are set to the ground potential, a first capacitor C101 and a second capacitor C102b can be omitted.

The third rule is a rule that as shown in FIG. 8, one first capacitor C1 is provided between two first diodes D1 connected in series to each other and one second capacitor C2 is provided between two second diodes D2 connected in series to each other. The two first diodes D1 connected in series to each other are directed in the same direction between the input terminal T1 and the output terminal 12. That is, one of the anode and the cathode of each of the two first diodes D1 connected in series to each other is connected to the input terminal T1 side, and the other is connected to the output terminal T2 side. Further, the two second diodes D2 connected in series to each other are directed in the same direction between the node N and the ground. That is, one of the anode and the cathode of each of the two second diodes D2 connected in series to each other is connected to the node N side, and the other is connected to the ground side.

The third rule has an exception. The exception is an exception that as shown in FIGS. 9 and 10, the two first diodes D connected in reverse series to each other are directly connected to each other and the two second diodes D2 connected in reverse series to each other are directly connected to each other. The two first diodes D1 connected in reverse series to each other are directed in mutually opposite directions between the input terminal T1 and the output terminal T2. That is, the anodes or the cathodes of the two first diodes D1 connected in reverse series to each other are directly connected to each other. Further, the two second diodes D2 connected in reverse series to each other are directed in mutually opposite directions between the node N and the ground. That is, the anodes or the cathodes of the two second diodes D2 connected in reverse series to each other are directly connected to each other.

Further, in a case where a capacitor is provided between the output terminal T2 and the electrode (the upper electrode or the lower electrode) of the plasma processing apparatus, one first diode D1 which is closest to the output terminal T2 side on the electrical path between the node N and the output terminal T2, among all the first diodes D1 of the series part SU, and the output terminal 12 may be directly connected to each other with the first capacitor C1 between them omitted. For example, in a case where a capacitor is provided between the output terminal T2 and the electrode of the plasma processing apparatus, the first capacitor C1 which is closest to the output terminal T2, among all the first capacitors C1 shown in FIGS. 9 and 10 may be omitted.

FIGS. 4 to 7 are referred to again. The matching devices shown in FIGS. 4 to 7 are configured according to the first to third rules. A matching device 200A shown in FIG. 4 includes a series part 202, a parallel part 204, a direct-current power source 206, and a direct-current power source 208. The matching device 200A may further include the impedance sensor 110 and the power source control unit 112, as with the matching device 100.

The series part 202 is provided on a power supply line 218 between an input terminal 200a and an output terminal 200b. The input terminal 200a is a terminal to which a radio frequency wave is input. That is, the input terminal 200a is a terminal which is connected to a radio frequency power source. The output terminal 200b is a terminal for outputting a radio frequency wave. That is, the output terminal 200b is a terminal which is connected to the load on the chamber body 12 side.

The series part 202 includes a plurality of first diodes 221 and a plurality of first capacitors 231. The plurality of first diodes 221 are PN junction diodes. The plurality of first diodes 221 and the plurality of first capacitors 231 configure a plurality of first element groups G1. Each of the plurality of first element groups G1 includes one first diode among the plurality of first diodes 221, and one first capacitor connected in series to the one first diode, among the plurality of first capacitors 231. The plurality of first element groups G1 are connected in order between the input terminal 200*a* and the output terminal 200*b*.

In the series part 202, one first capacitor 231 is provided so as to separate a direct-current potential between the series part 202 and the parallel part 204 according to the second rule. Therefore, all the first diodes 221 which are included in the series part 202 are provided on the output terminal 200*b* side with respect to the one first capacitor 231. Accordingly, a direct-current potential is separated between the series part 202 and the parallel part 204.

In the series part 202, two first diodes 221 are connected in series to each other. Another first capacitor 231 is provided between the two series-connected first diodes 221 according to the third rule.

The parallel part 204 is provided between a node 200*n* and the ground. The node 200*n* is provided on the power supply line 218 between the input terminal 200*a* and the output terminal 200*b*. In an embodiment, the node 200*n* is provided on the power supply line 218 between the series part 202 and the input terminal 200*a*.

The parallel part 204 includes a plurality of second diodes 222 and a plurality of second capacitors 232. The plurality of second diodes 222 are PN junction diodes. The plurality of second diodes 222 and the plurality of second capacitors 232 configure a plurality of second element groups G2. Each of the plurality of second element groups G2 includes one second diode among the plurality of second diodes 222, and one second capacitor connected in series to the one second diode, among the plurality of second capacitors 232. The plurality of second element groups G2 are connected in order between the node 200*n* and the ground.

In the parallel part 204, the plurality of second diodes 222 are provided on the node 200*n* side with respect to one second capacitor 232 which is included in the parallel part 204, according to the first rule. In this way, a direct-current potential is separated between all the second diodes 222 of the parallel part 204 and the ground.

In the parallel part 204, two second diodes 222 are connected in series to each other. Another second capacitor 232 is provided between the two series-connected second diodes 222 according to the third rule.

The direct-current power source 206 is a variable direct-current power source. The direct-current power source 206 is provided to apply reverse bias voltages to the plurality of first diodes 221 of the series part 202. The positive electrode of the direct-current power source 206 is connected to the cathodes of the plurality of first diodes 221 through a plurality of resistor elements, respectively. The negative electrode of the direct-current power source 206 is connected to the anodes of the plurality of first diodes 221 through a plurality of resistor elements, respectively.

The direct-current power source 208 is a variable direct-current power source. The direct-current power source 208 is provided to apply reverse bias voltages to the plurality of second diodes 222 of the parallel part 204. The positive electrode of the direct-current power source 208 is connected to the cathodes of the plurality of second diodes 222 through a plurality of resistor elements, respectively. The negative electrode of the direct-current power source 208 is connected to the anodes of the plurality of second diodes 222 through a plurality of resistor elements, respectively.

In the matching device 200A, the plurality of first diodes 221 and the plurality of second diodes 222 are used rather than a variable capacitor capable of mechanically changing a capacitance. The capacitance (junction capacitance) of each of the plurality of first diodes 221 and the plurality of second diodes 222 changes rapidly in response to the reverse bias voltage. Therefore, the matching device 200A can realize a high-speed matching operation.

As described above, the layout of the circuit of the matching device 200A complies with the first to third rules. Therefore, it is possible to apply reverse bias voltages to the plurality of first diodes 221 of the series part 202 by one direct-current power source 206. Further, it is possible to apply reverse bias voltages to the plurality of second diodes 222 of the parallel part 204 by one direct-current power source 208. Therefore, according to the matching device 200A, the number of variable direct-current power sources is reduced. It should be noted that the resistor element indicated by reference sign "R4" in FIG. 4 may be omitted. Further, the second capacitor 232 indicated by reference sign "C4" may be omitted according to the exception of the first rule.

Figure 5:
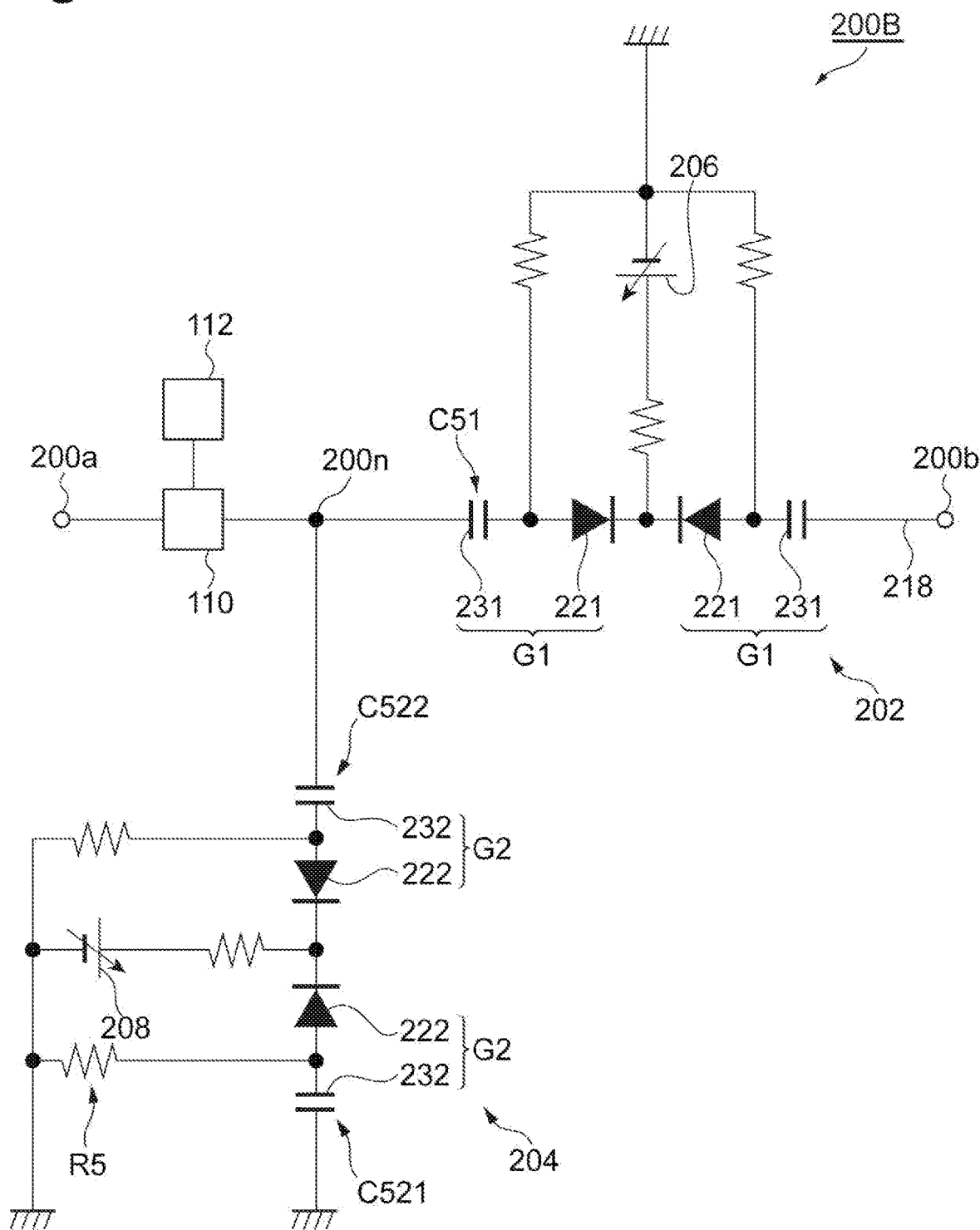
FIG. 5 illustrates a matching device according to still another embodiment.

Next, FIG. 5 is referred to. Hereinafter, different points of a matching device 200B shown in FIG. 5 from the matching device 200A will be described, and overlapping description will be omitted. In the matching device 200B, the two first diodes 221 of the series part 202 are connected in reverse series to each other. The two first diodes 221 are directly connected to each other according to the exceptions of the third rule. Specifically, the cathodes of the two first diodes 221 are directly connected to each other. In the matching device 200B, the positive electrode of the direct-current power source 206 is connected to the cathodes of the two first diodes 221 through a resistor element.

Further, in the matching device 200B, the two second diodes 222 of the parallel part 204 are connected in reverse series to each other. The two second diodes 222 are directly connected to each other according to the exceptions of the third rule. Specifically, the cathodes of the two second diodes 222 are directly connected to each other. In the matching device 200B, the positive electrode of the direct-current power source 208 is connected to the cathodes of the two second diodes 222 through a resistor element.

In FIG. 5, the resistor element indicated by reference sign "R5" may be omitted. Further, the second capacitor 232 indicated by reference sign "C521" may be omitted according to the exception of the first rule. Further, the first capacitor 231 indicated by reference sign "C51" and the second capacitor 232 indicated by reference sign "C522" may be omitted according to the exception of the second rule.

Figure 6:
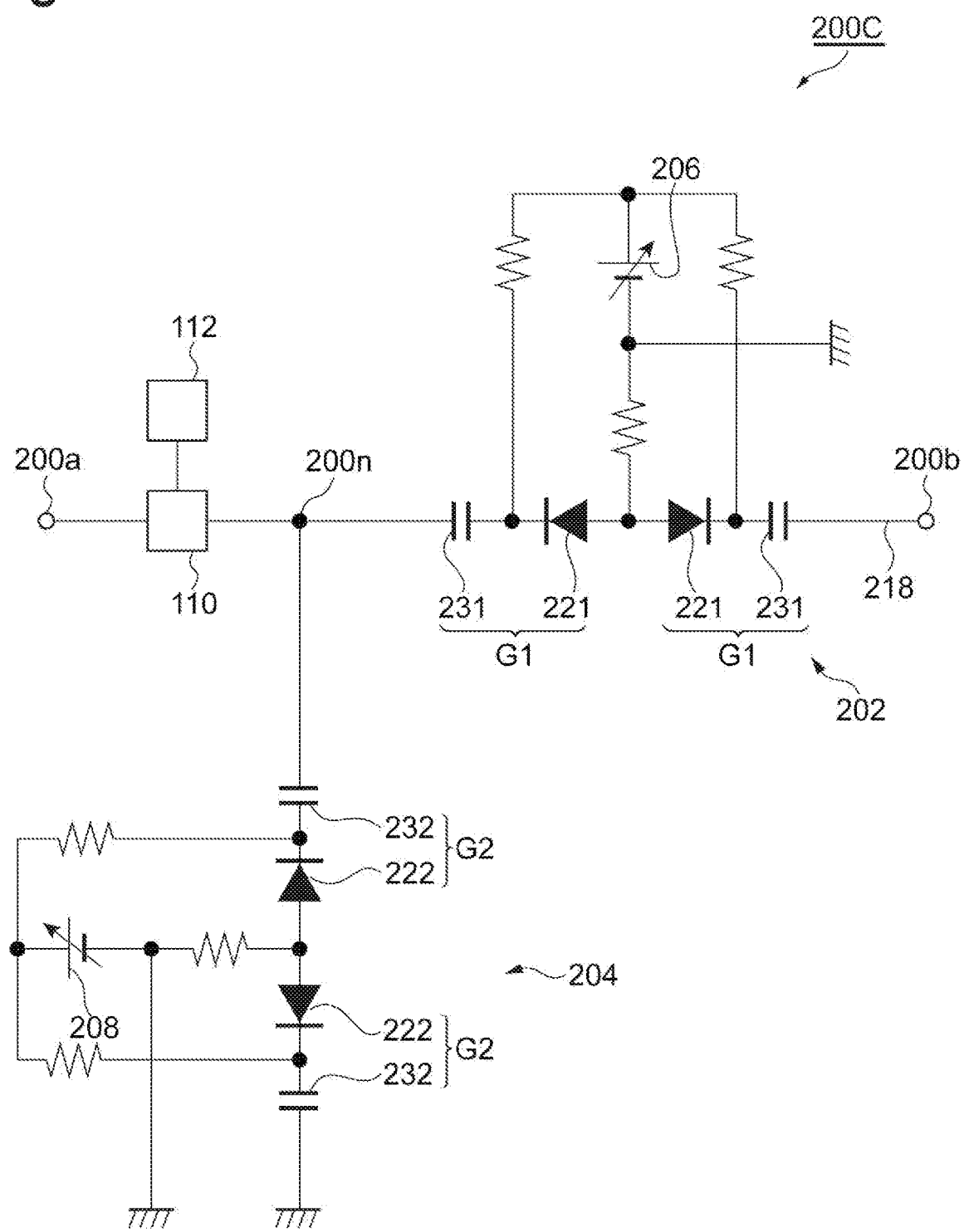
FIG. 6 illustrates a matching device according to still another embodiment.

Next, FIG. 6 is referred to. Hereinafter, different points of a matching device 200C shown in FIG. 6 from the matching device 200A will be described, and overlapping description will be omitted. In the matching device 200C, the two first diodes 221 of the series part 202 are connected in reverse series to each other. The two first diodes 221 are directly connected to each other according to the exceptions of the third rule. Specifically, the anodes of the two first diodes 221 are directly connected to each other. In the matching device 200C, the negative electrode of the direct-current power source 206 is connected to the anodes of the two first diodes 221 through a resistor element.

Further, in the matching device 200C, the two second diodes 222 of the parallel part 204 are connected in reverse series to each other. The two second diodes 222 are directly connected to each other according to the exceptions of the third rule. Specifically, the anodes of the two second diodes 222 are directly connected to each other. In the matching device 200C, the negative electrode of the direct-current power source 208 is connected to the anodes of the two second diodes 222 through a resistor element.

Figure 7:
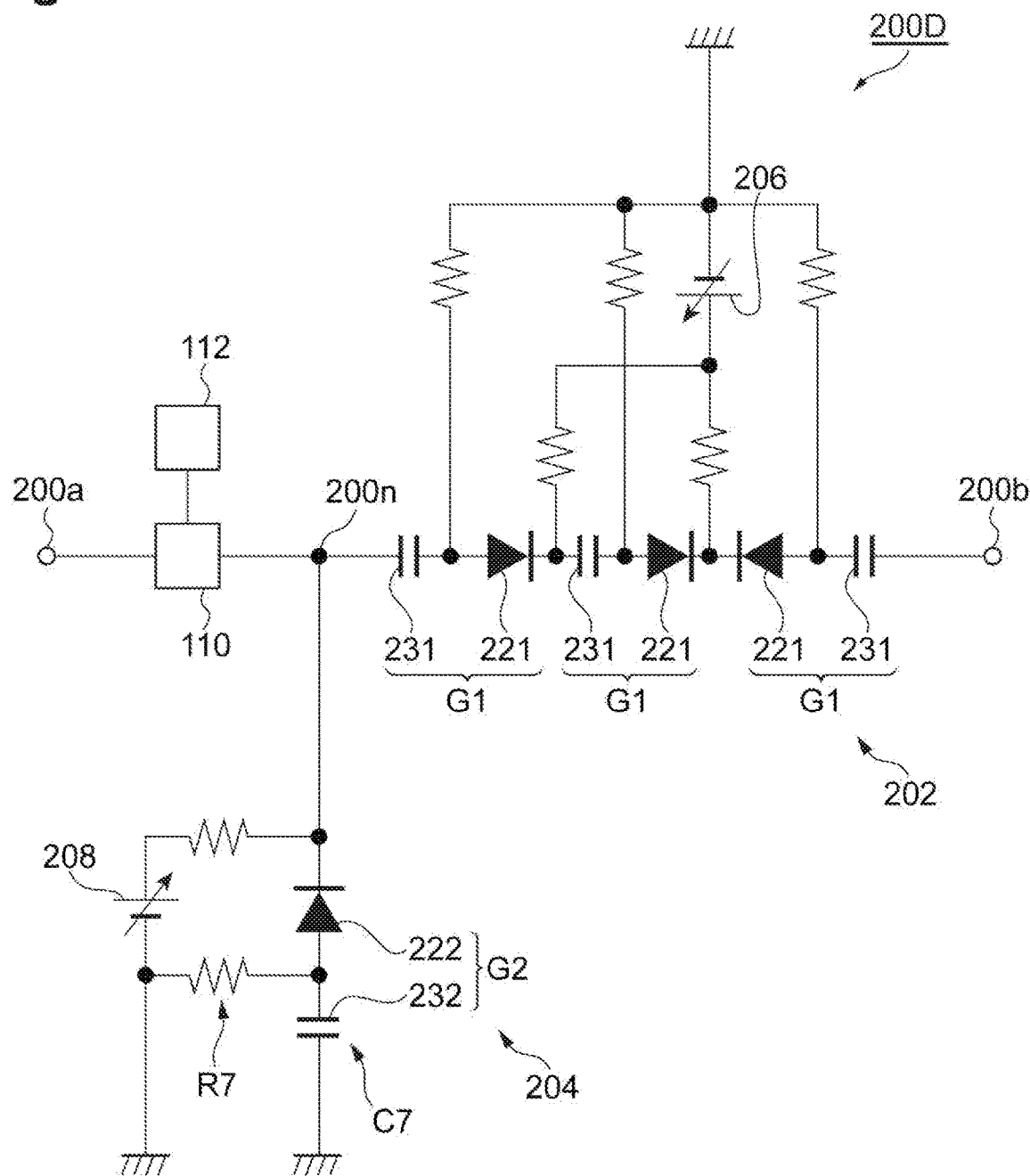
FIG. 7 illustrates a matching device according to still another embodiment.

Next, FIG. 7 is referred to. Hereinafter, different points of a matching device 200D shown in FIG. 7 from the matching device 200A will be described, and overlapping description will be omitted. In the matching device 200D, the series part 202 has three first element groups G1, and the parallel part 204 has one second element group G2.

In the series part 202 of the matching device 200D, the two first diodes 221 on the node 200n side are connected in series to each other. One first capacitor 231 is provided between the two first diodes 221 connected in series to each other. Further, the two first diodes 221 on the output terminal 200b side are connected in reverse series to each other. The two first diodes 221 connected in reverse series to each other are directly connected to each other. That is, a capacitor is not provided between the two first diodes 221 connected in reverse series to each other. The positive electrode of the direct-current power source 206 is connected to the cathodes of the plurality of first diodes 221 through resistor elements, and the negative electrode of the direct-current power source 206 is connected to the anodes of the plurality of first diodes 221 through resistor elements.

The parallel part 204 of the matching device 200D has one second element group G2, as described above. The positive electrode of the direct-current power source 208 is connected to the cathode of the second diode 222 through a resistor element, and the negative electrode of the direct-current power source 208 is connected to the anode of the second diode 222 through a resistor element.

As with the matching device 200D, the number of first element groups G1 in the series part 202 and the number of second element groups G2 in the parallel part 204 may be different from each other. Further, the number of first element groups G1 in the series part 202 and the number of second element groups G2 in the parallel part 204 may be any number of 1 or more. Further, in the series part 202, the connection between the first diodes 221 may be series connection or may be reverse series connection. Also in the parallel part 204, similarly, the connection between the second diodes 222 may be series connection or may be reverse series connection. Further, in the series part 202, both the series connection and the reverse series connection may be included as the connection between the first diodes 221. Also in the parallel part 204, similarly, both the series connection and the reverse series connection may be included as the connection between the second diodes 222.

It should be noted that the resistor element indicated by reference sign "R7" in FIG. 7 may be omitted. Further, the second capacitor 232 indicated by reference sign "C7" may be omitted according to the exception of the first rule.

Figure 11:
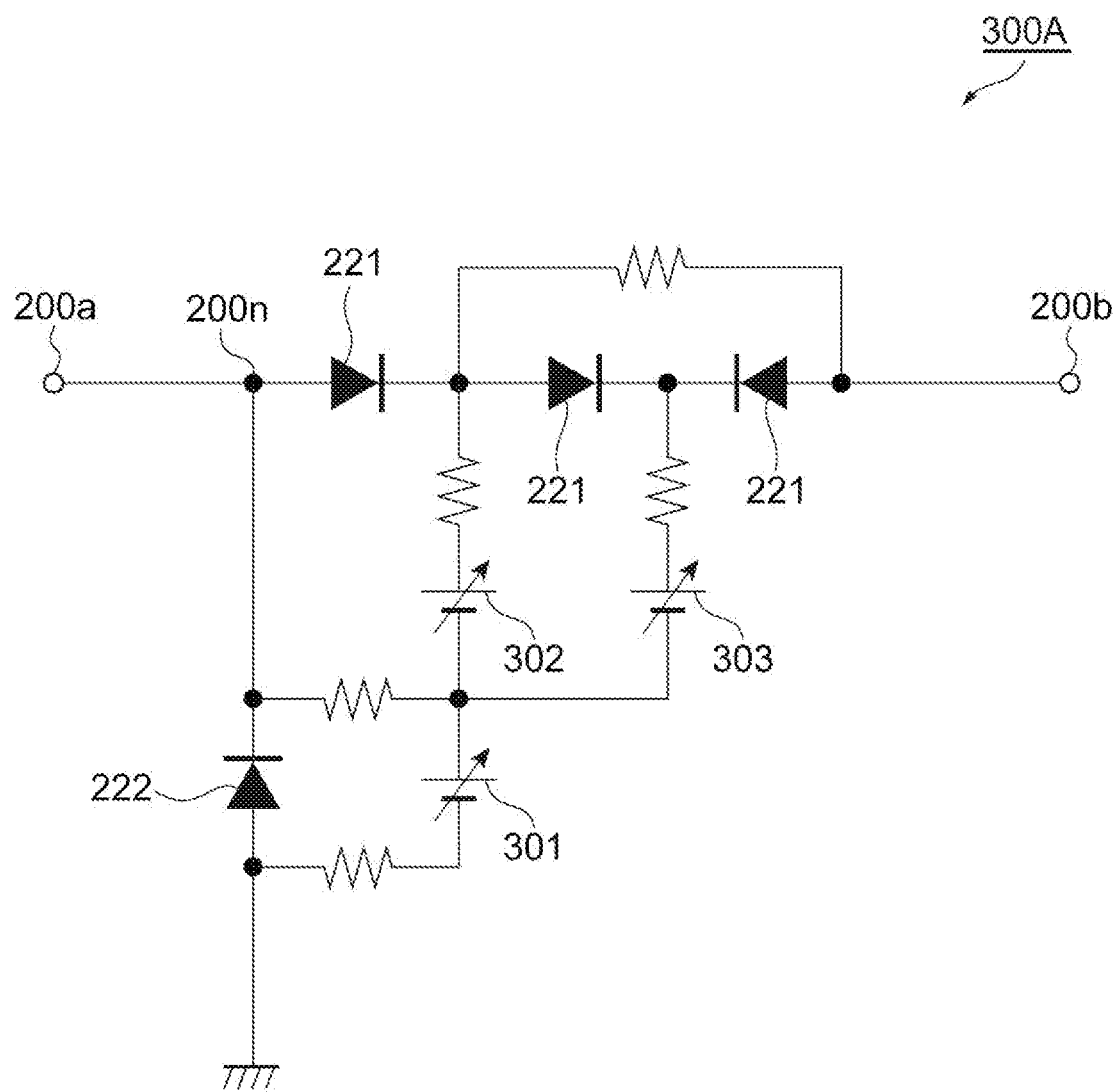
FIG. 11 illustrates a matching device according to a reference example.
Figure 12:
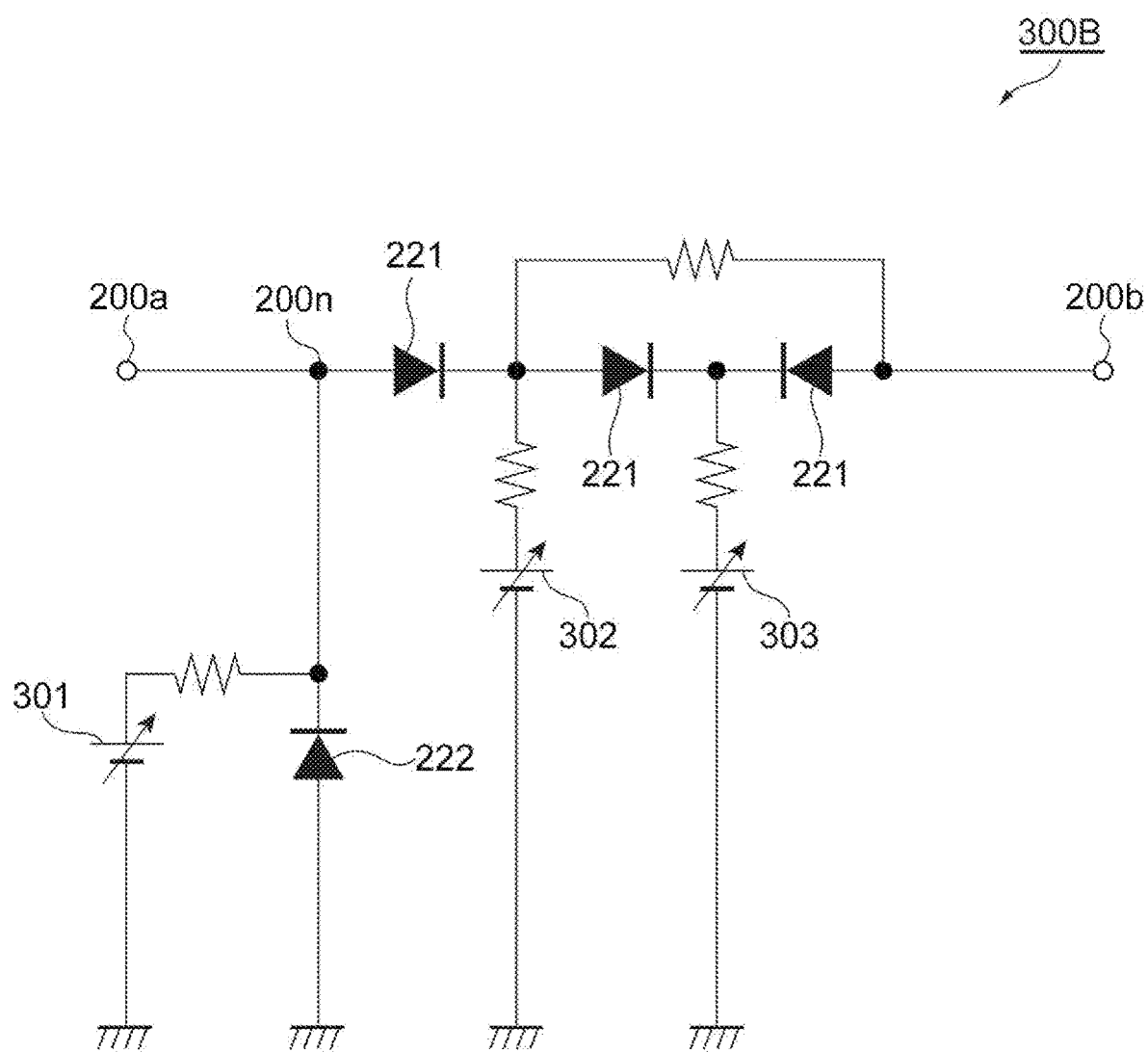
FIG. 12 illustrates a matching device according to another reference example.

Hereinafter, FIGS. 11 and 12 will be referred to. FIGS. 11 and 12 illustrate matching devices according to reference examples. A matching device 300A shown in FIG. 11 and a matching device 300B shown in FIG. 12 have a configuration in which the three first capacitors 231 and the second capacitor 232 are removed from the matching device 200D shown in FIG. 7, and do not comply with the first to third rules. For this reason, as shown in FIGS. 11 and 12, in the matching device 300A and the matching device 300B, three direct-current power sources 301, 302, and 303 are needed to apply reverse bias voltages to the three first diodes 221 and the second diode 222. On the other hand, in the matching device 200D shown in FIG. 7, it is possible to apply reverse bias voltages to the three first diodes 221 and the second diode 222 by the two direct-current power sources 206 and 208. In this manner, in the matching devices having the circuits of the layouts according to the first to third rules, it is possible to reduce the number of direct-current power sources.

Further, in the matching device 300A shown in FIG. 11, the negative electrode of the direct-current power source 302 and the negative electrode of the direct-current power source 303 are connected to the positive electrode of the direct-current power source 301. That is, the negative electrode of the direct-current power source 302 and the negative electrode of the direct-current power source 303 are not electrically connected to the ground but float from the ground. Therefore, it is not possible to use an amplifier type direct-current power source for the direct-current power source 302 and the direct-current power source 303 of the matching device 300A, and it is necessary to use a switching type direct-current power source. In the switching type direct-current power source, a relatively long time is required for a voltage transition. Therefore, a relatively long time is required for the matching operation of the matching device 300A. On the other hand, an amplifier type direct-current power source capable of responding at a high-speed can be used for the matching device according to the embodiments. Therefore, the matching device according to the embodiment can realize a high-speed matching operation.

Figure 13:
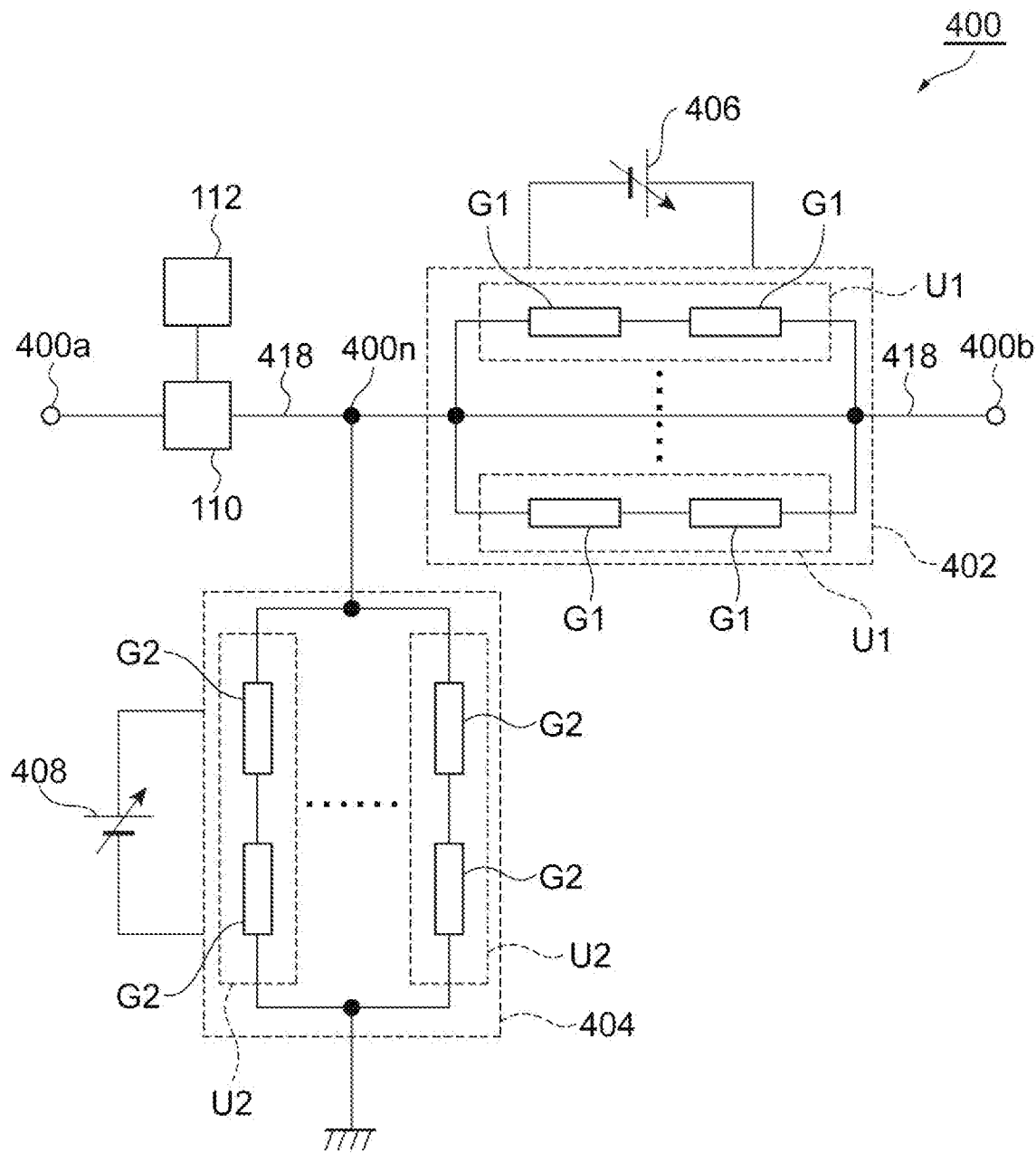
FIG. 13 illustrates a matching device according to still another embodiment.

A matching device according to still another embodiment will be described. FIG. 13 illustrates a matching device according to still another embodiment. A matching device 400 shown in FIG. 13 includes a series part 402, a parallel part 404, a direct-current power source 406, and a direct-current power source 408. The matching device 400 may further include the impedance sensor 110 and the power source control unit 112, as with the matching device 100.

The series part 402 is provided between an input terminal 400a and an output terminal 400b. The input terminal 400a is a terminal to which a radio frequency wave is input. That is, the input terminal 400a is a terminal which is connected to a radio frequency power source. The output terminal 400b is a terminal for outputting a radio frequency wave. That is, the output terminal 400b is a terminal which is connected to the load on the chamber body 12 side.

The series part 402 has a plurality of first units U1. The plurality of first units U1 are connected in parallel between the input terminal 400a and the output terminal 400b. Each of the plurality of first units U1 has one or more first element groups G1. In the example shown in FIG. 13, each of the plurality of first units U1 has a plurality of first element groups G1. The plurality of first element groups G1 are connected in order. The first element group G1 includes a first diode and a first capacitor connected in series to the first diode.

The parallel part 404 is provided between a node 400n and the ground. The node 400n is provided on a power supply line 418 between the input terminal 400a and the output terminal 400b. In an embodiment, the node 400n is provided on the power supply line 418 between the series part 402 and the input terminal 400a.

The parallel part 404 has a plurality of second units U2. The plurality of second units U2 are connected in parallel between the node 400n and the ground. Each of the plurality of second units U2 has one or more second element groups G2. In the example shown in FIG. 13, each of the plurality of second units U2 has a plurality of second element groups G2. The plurality of second element groups G2 are connected in order. The second element group G2 includes a second diode and a second capacitor connected in series to the second diode.

Also in the matching device 400, the layout of the circuit complies with the first to third rules. That is, in each of the plurality of second units U2, all the second diodes are provided on the node 400n side with respect to one second capacitor. Further, in each of the plurality of first units U1, all the first diodes are provided on the output terminal 400b side with respect to one first capacitor. Further, in each of the plurality of first units U1, in a case where two first diodes are connected in series to each other, one first capacitor is provided between the two first diodes. Further, in each of the plurality of first units U1, in a case where two first diodes are connected in reverse series to each other, the two first diodes are directly connected to each other. Further, in each of the plurality of second units U2, in a case where two second diodes are connected in series to each other, one second capacitor is provided between the two second diodes. Further, in each of the plurality of second units U2, in a case where two second diodes are connected in reverse series to each other, the two second diodes are directly connected to each other.

According to the matching device 400, it is possible to apply variable reverse bias voltages to a plurality of first diodes which are included in the plurality of first units U1 by a single direct-current power source 406. Further, it is possible to apply variable reverse bias voltages to a plurality of second diodes which are included in the plurality of second units U2 by a single direct-current power source 408.

As described above, according to the matching devices of various embodiments, a high-speed matching operation is realized. Further, according to the matching devices of various embodiments, the impedance can be changed by an amount corresponding to the product of the number of stages in which the reverse bias voltage of the direct-current power source for the series part can be changed and the number of stages in which the reverse bias voltage of the direct-current power source of the parallel part can be changed. Therefore, according to the matching devices of various embodiments, compared to a matching device using a capacitor capable of mechanically changing a capacitance, it becomes possible to change the impedance with a larger number of stages.

Hereinafter, the criteria for selection of diodes which are desirable as the first diodes and the second diodes of the matching devices of various embodiments will be described. In the matching devices of the embodiments described above, reverse bias voltages are applied to the first diode and the second diode. Further, a radio frequency voltage from a radio frequency power source is also applied to the first diode and the second diode. Therefore, it is desirable that a reverse withstand voltage $V_R$ of each of the first diode and the second diode satisfies the following expression (1). Here, $V_{DC}$ is the maximum value of the reverse bias voltage, and $V_P$ is ½ of the crest value $V_{pp}$ of a radio frequency voltage.

$V_R > V_{DC} + V_P$ ... (1)

It is desirable that a diode which is used in the matching device of the plasma processing apparatus 10 has the reverse withstand voltage $V_R$ of 1000 V or more, for example.

Further, it is desirable that a diode which is used as each of the first diodes and the second diodes of the matching devices of the embodiments described above has a rated current of 10 A or more. The rated current affects the variable impedance range of the diode and the radio frequency resistance of the diode.

Further, it is desirable that a diode which is used as each of the first diodes and the second diodes of the matching devices of the embodiments described above is a diode having a terminal shape other than a lead terminal. In a diode having a lead terminal, there is a tendency that resistance is high with respect to a radio frequency wave having a radio frequency such as several tens of MHz due to the lead terminal being thin. Such high resistance affects the variable impedance range.

Further, it is desirable that a diode which is used as each of the first diodes and the second diodes of the matching devices of the embodiments described above further satisfies the following criteria in a case where the frequency of the radio frequency wave is 40.68 MHz. That is, it is desirable that such a diode satisfies the features that diode resistance is within the range of 0 to 1Ω, a variable capacitance range is included within a desired variable impedance range, a variable capacitance range is in a range of 10 pF to 10000 pF, the range of the reverse bias voltage corresponding the variable capacitance range has a margin in a range of 15% to 90% with respect to the reverse withstand voltage of the diode, and an overlapping range is present between the condition of the diode resistance and the condition of the variable capacitance range. An example of a diode that satisfies the selection criteria is VS-85HF160 manufactured by Vishay Corp.

Hereinbefore, various embodiments have been described. However, various modifications may be made without being limited to the above-described embodiments. For example, the matching devices of the various embodiments described above can be used not only in a capacitively coupled plasma processing apparatus but also in other types of plasma processing apparatuses. The matching devices of the various embodiments described above can be used in, for example, an inductively coupled plasma processing apparatus, or a plasma processing apparatus using surface waves such as microwaves.

REFERENCE SIGNS LIST

10: plasma processing apparatus
12: chamber body
12c: chamber
16: placing table
18: lower electrode
20: electrostatic chuck
30: upper electrode
50: exhaust device
61: first radio frequency power source
62: second radio frequency power source
63: matching device
64: matching device
100, 100A, 200A, 200B, 200C, 200D, 400: matching device
102, 202, 402: series part
104, 204, 404: parallel part
106, 108, 206, 208, 406, 408: direct-current power source
121, 221: first diode
122, 222: second diode
131, 231: first capacitor
132, 232: second capacitor
U1: first unit
U2: second unit

The invention claimed is:
1. A matching device for impedance matching in a plasma processing apparatus, comprising:

a series part including a first diode having a variable capacitance, the series part being provided between an input terminal of a radio frequency wave and an output terminal of an radio frequency wave;

a parallel part including a second diode having a variable capacitance, the parallel part being provided between a node between the input terminal and the output terminal and a ground; and a plurality of direct-current power sources which are variable direct-current power sources provided to apply reverse bias voltages to the first diode and the second diode, respectively.

2. A plasma processing apparatus comprising:

a chamber body providing a chamber;

a radio frequency power source;

an electrode for generating plasma or generating a bias in the chamber, the electrode being electrically connected to the radio frequency power source; and the matching device according to claim 1, the matching device being connected between the radio frequency power source and the electrode.

3. The matching device according to claim 1, wherein the series part further includes a first capacitor connected in series to the first diode, the parallel part further includes a second capacitor connected in series to the second diode, the first capacitor is connected between the node and the first diode, and the second capacitor is connected between the ground and the second diode.

4. The matching device according to claim 2, wherein the series part includes:

a plurality of first diodes which are diodes each having a variable capacitance, include the first diode, and are provided on a side of the output terminal with respect to the first capacitor; and a plurality of first capacitors including the first capacitor, a plurality of first element groups, each of which includes one first diode among the plurality of first diodes and one first capacitor connected in series to the one first diode, among the plurality of first capacitors, are connected in order between the input terminal and the output terminal, and one direct-current power source among the plurality of direct-current power sources is provided to apply reverse bias voltages to the plurality of first diodes.

5. The matching device according to claim 4, wherein one first capacitor among the plurality of first capacitors is provided between two first diodes connected in series to each other, among the plurality of first diodes.

6. The matching device according to claim 4, wherein two first diodes are connected in reverse series to each other, among the plurality of first diodes, and are directly connected to each other.

7. The matching device according to claim 3, wherein the parallel part includes:

a plurality of second diodes which are diodes each having a variable capacitance, include the second diode, and are provided on a side of the node with respect to the second capacitor; and a plurality of second capacitors including the second capacitor, a plurality of second element groups, each of which includes one second diode among the plurality of second diodes and one second capacitor connected in series to the one second diode, among the plurality of second capacitors, are connected in order between the node and the ground, and another direct-current power source among the plurality of direct-current power sources is provided to apply reverse bias voltages to the plurality of second diodes.

8. The matching device according to claim 7, wherein one second capacitor among the plurality of second capacitors is provided between two second diodes connected in series to each other, among the plurality of second diodes.

9. The matching device according to claim 7, wherein two second diodes are connected in reverse series to each other, among the plurality of second diodes, and are directly connected to each other.

* * * * *